United States Patent
Yokokawa et al.

(10) Patent No.: US 7,608,548 B2
(45) Date of Patent: Oct. 27, 2009

(54) METHOD FOR CLEANING A MULTILAYER SUBSTRATE AND METHOD FOR BONDING SUBSTRATES AND METHOD FOR PRODUCING A BONDED WAFER

(75) Inventors: Isao Yokokawa, Gunma (JP); Kiyoshi Mitani, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 451 days.

(21) Appl. No.: 10/570,949

(22) PCT Filed: Sep. 7, 2004

(86) PCT No.: PCT/JP2004/012960

§ 371 (c)(1),
(2), (4) Date: Mar. 7, 2006

(87) PCT Pub. No.: WO2005/027214

PCT Pub. Date: Mar. 24, 2005

(65) Prior Publication Data

US 2007/0023066 A1 Feb. 1, 2007

(30) Foreign Application Priority Data

Sep. 10, 2003 (JP) ............................. 2003-318040
Sep. 10, 2003 (JP) ............................. 2003-318078

(51) Int. Cl.
*H01L 21/302* (2006.01)
(52) U.S. Cl. ...................... 438/752; 438/745; 438/750; 134/1.2
(58) Field of Classification Search ................. 438/745, 438/750, 752, 753; 134/1.1, 1.3, 1.2
See application file for complete search history.

(56) References Cited

U.S. PATENT DOCUMENTS

| 5,906,708 | A | * | 5/1999 | Robinson et al. ............ 438/694 |
| 6,917,096 | B2 | * | 7/2005 | Sugiyama et al. ........... 257/616 |
| 7,018,910 | B2 | * | 3/2006 | Ghyselen et al. ............ 438/458 |
| 2002/0072130 | A1 | | 6/2002 | Cheng et al. |
| 2003/0136331 | A1 | * | 7/2003 | Ami et al. ...................... 117/2 |
| 2003/0168654 | A1 | * | 9/2003 | Cheng et al. .................. 257/19 |

FOREIGN PATENT DOCUMENTS

| JP | A 07-29782 | 1/1995 |
| JP | A 07-240394 | 9/1995 |
| JP | A08-264498 | 10/1996 |
| JP | A 2001-217430 | 8/2001 |
| JP | A 2002-164520 | 6/2002 |
| JP | A 305293 | 10/2002 |
| JP | A 2003-86648 | 3/2003 |

* cited by examiner

OTHER PUBLICATIONS

Alok Sareen et al., "Effect of Si cap layer on parasitic channel operation in Si/SiGe metal-oxide-semiconductor structures", Journal of Applied Physics, vol. 93, No. 6, pp. 3545-3552, Mar. 15, 2003.

*Primary Examiner*—Lan Vinh
(74) *Attorney, Agent, or Firm*—Oliff & Berridge, PLC

(57) ABSTRACT

Disclosed is a method for cleaning a multilayer substrate at least having a silicon single crystal wafer with a SiGe layer epitaxially grown on a surface of the silicon single crystal wafer, where the SiGe layer is an outermost surface of the SiGe layer and then cleaning the multilayer substrate with a first cleaning liquid capable of etching the protective film so that the protective film remains. The protective film prevents roughening of the surface of the SiGe layer while the cleaning is performed. The cleaning is performed. The cleaning is performed so that a thickness of the remaining protective film is from 1 nm to 100 nm.

13 Claims, 6 Drawing Sheets

METHOD FOR CLEANING A MULTILAYER SUBSTRATE AND METHOD FOR BONDING SUBSTRATES AND METHOD FOR PRODUCING A BONDED WAFER

TECHNICAL FIELD

The present invention relates to a method for cleaning a multilayer substrate having a SiGe layer, a method for bonding substrates, and a method for producing a bonded wafer having a Si epitaxial layer on a SiGe layer.

BACKGROUND TECHNOLOGY

In recent years, for satisfying demands for high-speed semiconductor devices, semiconductor devices such as high-speed MOSFET (Metal-Oxide-Semiconductor Field Effect Transistor) in which a Si layer obtained by performing epitaxial growth through a SiGe (Silicon Germanium) layer on a Si (Silicon) substrate is used for a channel region have been suggested.

In this case, because a SiGe crystal is larger in lattice constant than a Si crystal, tensile strain is generated in a Si layer epitaxially-grown on a SiGe layer (hereinafter, a Si layer in which strain is generated in this manner is referred to as a strained Si layer). Energy band structure of a Si crystal is changed by the strained stress, and as a result, degeneracy of the energy band is removed and high-energy band with high carrier mobility is formed. Therefore, the MOSFET that the strained Si layer is used as a channel region shows high-speed operation property that is about 1.3-8 times higher than usual.

Because magnitude of the tensile strain generated in the strained Si layer becomes larger along with Ge concentration of the SiGe layer being higher, the Ge concentration of the SiGe layer is an important parameter. Hereinafter, a SiGe layer having Ge composition rate X ($0<X<1$) is occasionally described as a $Si_{1-X}Ge_X$ layer.

As a method for forming such a strained Si layer, besides the above method that an epitaxial method is main, there is a known method for forming a $Si_{1-X}Ge_X$ layer on a silicon substrate to be a bond wafer, producing a bonded SOI substrate that a surface of the formed $Si_{1-X}Ge_X$ layer of the bond wafer is bonded to a silicon substrate to be a base wafer through an oxide film and thereby to be SOI (Silicon On Insulator) structure, and then thinning the silicon substrate of the bond wafer to be a strained Si layer, for example, as disclosed in Japanese Patent Application Laid-open (kokai) No. 2001-217430 and No. 2002-164520. In this case, as disclosed in Japanese Patent Application Laid-open (kokai) No. 2002-164520, it is also possible that a surface of the $Si_{1-X}Ge_X$ layer is subjected to thermal oxidation according to need thereby to be a condensation SiGe layer that the Ge concentration is enhanced.

In this case, the thinning of a silicon substrate of the bond wafer is performed with a grinding and polishing method, vapor etching such as PACE (Plasma Assisted Chemical Etching) method, an ion implantation delamination method (which is also referred to as a smart cut [a registered trademark] method), or the like.

The ion implantation delamination method is a technology of, implanting at least one of a hydrogen ion and rare gas ions from a surface of a bond wafer, namely, a surface of the $Si_{1-X}Ge_X$ layer, to form a micro bubble layer inside the bond wafer such as near the surface thereof, superposing closely the bond wafer in the ion implanted surface side on a base wafer through an oxide film, then performing heat treatment (delaminating heat treatment) to delaminate the bond wafer as a thin film so that the micro bubble layer is a cleavage plane (a delaminating plane), and further performing heat treatment (bonding heat treatment) to bond the two wafers tightly to provide a bonded wafer.

In the disclosure of Japanese Patent Application Laid-open (kokai) No. 2002-305293, it is disclosed that a separating layer is formed by ion implantation into a silicon substrate of a bond wafer in which a $Si_{1-X}Ge_X$ layer, a silicon layer, and an insulator layer are formed on the silicon substrate. And a surface of the insulator layer of the bond wafer is bonded to a base wafer. Then, a silicon layer of the delaminated layer that is delaminated at the separating layer and transferred to the base wafer side is made to be a strained Si layer.

In general, in a bonded substrate such as a bonded wafer, it is desired that bonding force of the bonded plane is strong enough to prevent generation of problems such as delamination at the bonded plane. In general, evaluation of the bonding force at the bonded plane of the bonded substrate can be performed by an evaluation of surface energy of the bonded plane which is proportional to the bonding force. Measurement of the surface energy can be performed by using a razor-blade insertion method as disclosed in Japanese Patent Application Laid-open (kokai) No. 7-29782.

In the case that a surface of a SiGe layer is bonded to another silicon substrate through an oxide film as disclosed in Japanese Patent Application Laid-open (kokai) No. 2001-217430, particles or contaminants on the surfaces need to be removed by cleaning the bonded plane before bonding is performed. In the cleaning step, so-called SC-1 cleaning in which a mixed aqueous solution of $NH_4OH$ and $H_2O_2$ (SC-1: Standard Cleaning 1) that is one of general cleaning liquids for a silicon substrate is used as a cleaning liquid is generally performed.

DISCLOSURE OF THE INVENTION

As described above, in the case that a bonded wafer is produced by using an ion implantation delamination method, there has been a problem that contamination such as organic matter and metal impurities or roughening of a surface is caused on a surface such as a $Si_{1-X}Ge_X$ layer, a Si layer, and an insulator layer which are implanted surfaces when ions are implanted. And, in the case that a surface of the $Si_{1-X}Ge_X$ layer or the like and a base wafer are closely superposed through an oxide film after the ion implantation, bonding defects such as voids or blisters are generated in a bonded plane after delaminating heat treatment. Such voids or blisters degrade process yield of producing bonded wafers.

In this case, it is thought that by performing such SC-1 cleaning as mentioned above, organic matter, metal impurities, and the like on the surface are removed.

By subjecting a silicon substrate to SC-1 cleaning, cleaning effect can be enhanced because a surface of the silicon substrate is slightly etched and removed. However, it has become clear that by subjecting a surface of a SiGe layer to SC-1 cleaning, surface roughness of the SiGe layer after being cleaned is larger than that in the case of subjecting a surface of a silicon substrate to SC-1 cleaning. According to investigation of the present inventors, it has been found that this is caused because Ge etching rate is larger than Si etching rate, and the surface roughness becomes larger along with Ge concentration being higher. Therefore, in the case that a bonded substrate is produced by bonding a surface of a SiGe layer and a silicon substrate or the like after cleaning, bonding force of the bonded plane lowers. Such lowering of bonding force of the bonded plane causes delamination at the bonded plane in a later step such as thinning of the bond wafer, and lowering of process yield of producing bonded substrates is provoked.

For example, in the above-described production of a bonded wafer, there has been a problem that when a surface of a $Si_{1-X}Ge_X$ layer or the like after being cleaned and a base wafer are closely superposed through an oxide film, bonding defects such as voids or blisters are caused at the bonded plane after the delaminating heat treatment.

Moreover, in the case that a $Si_{1-X}Ge_X$ layer is bonded to a base wafer through a Si layer and an insulator layer thereon, there is possibility that dislocations are caused because lattice relaxation within a condensation SiGe layer is not performed sufficiently when Ge concentration is enhanced in the $Si_{1-X}Ge_X$ layer. In this case, a strained Si layer directly thereon is also bad in crystallinity.

The present invention has been accomplished in view of the above problems. The first object of the present invention is to provide a cleaning method and a bonding method that roughening of a surface of a SiGe layer caused when a multilayer substrate at least having a SiGe layer as an outermost surface layer is cleaned can be prevented, and lowering of bonding force of the bonded plane in the subsequent production of a bonded substrate can be prevented.

Moreover, the second object of the present invention is to provide a method for producing a bonded wafer for preventing generation of bonding defects such as voids or blisters at the bonded plane due to contamination such as organic matter or metal impurities adhering to a surface of a $Si_{1-X}Ge_X$ layer and roughening of the surface which are along with an ion implantation when an ion implantation delamination method is used, and preventing generation of dislocations on the $Si_{1-X}Ge_X$ layer to grow a strained Si layer of good quality thereon.

In order to accomplish the above first object, the present invention provides a method for cleaning a multilayer substrate at least having a SiGe layer as an outermost surface layer, at least, comprising steps of forming a protective film on a surface of the SiGe layer, and then cleaning the multilayer substrate with a first cleaning liquid capable of etching the protective film so that the protective film remains.

If a protective film is formed on a surface of the SiGe layer and then the protective film is cleaned with a first cleaning liquid so that the protective film remains as described above, roughening of the surface can be prevented because the SiGe layer is protected when the cleaning is performed. In addition, because the protective film is slightly etched and removed with the first cleaning liquid, the cleaning effect can be high and bonding force of the bonded plane can be prevented from lowering.

In this case, it is preferable that composition or temperature of the first cleaning liquid or the cleaning time is adjusted and thereby thickness of the remaining protective film is adjusted.

By adjusting composition or temperature of the first cleaning liquid or the cleaning time as describe above, thickness of the remaining protective film can be easily adjusted. Therefore, the thickness of the protective film can be an appropriate thickness.

Moreover, it is preferable that the cleaning is performed so that a thickness of the remaining protective film is from 1 nm to 100 nm.

If a thickness of the remaining protective film is from 1 nm to 100 nm as described above, the thickness is a sufficient thickness for protecting the SiGe layer from roughening of the surface due to the cleaning. And also in the case that a bonded SOI wafer having a strained Si layer is produced by bonding thereafter, a thickness from the strained Si layer to an oxide film can be sufficiently thin.

In these cases, the protective film consisting of Si can be used, and the first cleaning liquid consisting of a mixed aqueous solution of $NH_4OH$ and $H_2O_2$ can be used.

If the protective film consisting of Si is used and the first cleaning liquid consisting of a mixed aqueous solution of $NH_4OH$ and $H_2O_2$, so-called a SC-1 cleaning liquid, is used, roughening of a surface of the protective film to be a bonded plane is prevented and at the same time cleaning effect can be sufficiently high. Therefore, bonding force of the bonded plane can sufficiently prevented from lowering.

Moreover, the multilayer substrate cleaned with the first cleaning liquid may be cleaned with a second cleaning liquid which is capable of etching the protective film and which has a smaller etching rate for the protective film than the first cleaning liquid so that the protective film is removed and that the SiGe layer is exposed.

If the multilayer substrate cleaned with the first cleaning liquid is cleaned with a second cleaning liquid which is capable of etching the protective film and which has a smaller etching rate for the protective film than the first cleaning liquid so that the protective film is removed and that the SiGe layer is exposed as described above, the SiGe layer can be etched with the second cleaning liquid having a smaller etching rate so that roughening of the surface is not caused. Therefore, roughening of a surface of the SiGe layer to be a bonded plane can be prevented and at the same time the cleaning effect can be sufficiently high with the first cleaning liquid, thereby bonding force of the bonded plane can be prevented from lowering.

Moreover, the second cleaning liquid consisting of a mixed aqueous solution of $NH_4OH$ and $H_2O_2$ can be used.

If a SC-1 cleaning liquid consisting of a mixed aqueous solution of $NH_4OH$ and $H_2O_2$ which has a slower etching rate than the first cleaning liquid is used as the second cleaning liquid as described above, roughening of a surface of the SiGe layer to be a bonded plane is prevented and at the same time the cleaning effect can be sufficiently high, thereby bonding force of the bonded plane can be sufficiently prevented from lowering.

In these cases, it is preferable that a temperature of the second cleaning liquid is lower than a temperature of the first cleaning liquid.

If a temperature of the second cleaning liquid is lower than a temperature of the first cleaning liquid, an etching rate of the second cleaning liquid can be easily small so that roughening of the surface of the SiGe layer is not caused. Therefore, roughening of a surface of the SiGe layer to be a bonded plane can be prevented and at the same time the cleaning effect can be sufficiently high, thereby bonding force of the bonded plane can be prevented from lowering.

Moreover, the present invention provides a method for bonding substrates, wherein a surface of the SiGe layer or the protective film which is an outermost surface layer of the multilayer substrate cleaned by using the method for cleaning a multilayer substrate as described above and a surface of another substrate are bonded directly or through an insulator film.

If a surface of the SiGe layer or the protective film which is an outermost surface layer of the multilayer substrate cleaned by using the cleaning method as described above, in which roughening of the surface is prevented, which is cleaned sufficiently, and a surface of another substrate are bonded directly or through an insulator film, lowering of bonding force due to roughening of the surface of the bonded plane can be prevented. Therefore, troubles such as delamination at the bonded plane do not happen in subsequent steps. Thereby, improvement of process yield of producing a bonded substrate is achieved.

Moreover, for accomplishing the second object as described above, the present invention provides a method for producing a bonded wafer, at least, comprising steps of, forming a $Si_{1-X}Ge_X$ layer (0<X<1) on a surface of a silicon single crystal wafer to be a bond wafer, forming a protective layer on a surface of the $Si_{1-X}Ge_X$ layer, implanting at least one kind of a hydrogen ion and rare gas ions through the protective layer thereby to form an ion implanted layer, cleaning the bond wafer formed with the ion implanted layer, superposing closely a surface of the protective layer of the bond wafer after being cleaned and a base wafer through an insulator film or directly, then performing delamination at the ion implanted layer, subjecting a surface of the delaminated layer transferred to the base wafer side by the delamination to thermal oxidation thereby to form a thermal oxide film, removing the formed thermal oxide film thereby to expose a condensation SiGe layer in which Ge is condensed, and performing epitaxial growth of a silicon single crystal layer on a surface of the exposed condensation SiGe layer.

If a $Si_{1-X}Ge_X$ layer (0<X<1) and a protective layer are formed in order on a surface of a silicon single crystal wafer to be a bond wafer, and at least one kind of a hydrogen ion and rare gas ions is implanted through the protective layer thereby to form an ion implanted layer and then the bond wafer formed with the ion implanted layer is cleaned as described above, roughening of the surface of the $Si_{1-X}Ge_X$ layer by cleaning can be prevented with the protective layer and at the same time organic matter or metal impurities adhering to the implanted surface when ions are implanted can be removed. Therefore, generation of voids or blisters at the bonded plane after delaminating heat treatment can be prevented. Moreover, if a surface of the protective layer of the bond wafer after being cleaned and a base wafer are closely superposed through an insulator film such as a silicon oxide film or directly, it becomes easy to cause slipping on the interface between the protective layer and the base wafer, and in a condensation SiGe layer formed by Ge being condensed at the $Si_{1-X}Ge_X$ layer when the surface of the delaminated layer is subjected to thermal oxidation thereby to form a thermal oxide film, generation of dislocations is suppressed and at the same time lattice relaxation is performed sufficiently. Therefore, epitaxial growth of a strained Si layer of good quality can be performed on a surface thereof.

In addition, the above-described method for cleaning a multilayer substrate can be used in the cleaning. In this case, at least, steps that a $Si_{1-X}Ge_X$ layer is formed on a surface of a silicon single crystal bond wafer, a protective layer is formed on a surface of the $Si_{1-X}Ge_X$ layer, hydrogen ions and such are implanted through the protective layer thereby to form an ion implanted layer, and the bond wafer formed with the ion implanted layer is cleaned with a cleaning liquid capable of etching the protective layer so that the protective layer remains are performed.

In this case, it is preferable that the X is less than 0.2, and more preferably 0.15 or less.

If the Ge concentration is less than 20% and particularly 15% or less, the $Si_{1-X}Ge_X$ layer with sufficiently small number of dislocations can be obtained.

Moreover, it is preferable that as the protective layer, at least one kind of a silicon single crystal layer, an amorphous silicon layer, a polysilicon layer, and a silicon oxide film layer is formed.

If the protective layer is at least one kind of these layers, it can sufficiently function as a protective layer and can be easily formed by a vapor growth method or the like. Moreover, if it is a silicon oxide film layer, it can be formed by thermal oxidation and can be used as a BOX (Buried OXide) layer after bonded.

And, the ion implantation may be performed from the direction perpendicular to a surface of the protective layer.

Although it is more preferable to perform ion implantation from an oblique direction for preventing channeling which is caused in the ion implantation, in-plane uniformity of implantation depth distribution is degraded. If a protective layer is formed and ion implantation is performed from the direction perpendicular to a surface of the protective layer according to the present invention, the in-plane uniformity of implantation depth of ions can be enhanced and an ion implanted layer of good quality can be formed. In particular, if the protective layer is a silicon oxide film layer, an amorphous silicon layer, a polysilicon layer, or the like, occurrence of channeling can be effectively prevented.

In these cases, it is preferable that the insulator film through which a surface of the protective layer of the bond wafer after being cleaned and the base wafer are closely superposed is formed only on a surface of the base wafer.

If an interface between the protective layer and the insulator film formed only on a surface of the base wafer is the bonded plane, slipping is easily caused at the bonded plane. Therefore, lattice relaxation of the condensation SiGe layer in which Ge concentration is enhanced by formation of thermal oxide film at the later step is easily performed, thereby generation of dislocations can be suppressed in the condensation SiGe layer.

In these cases, it is preferable that as the base wafer, a silicon single crystal wafer or an insulator wafer is used.

If the base wafer is a silicon single crystal wafer as mentioned above, an insulator film can be easily formed by thermal oxidation, a vapor growth method, or the like, the base wafer can be superposed closely on a surface of the protective layer of the bond wafer through the insulator film. Moreover, the protective layer of the bond wafer may be directly bonded to an insulator base wafer such as quartz, silicon carbide, alumina, or diamond according to usage.

In these cases, a temperature when Ge in the SiGe layer is condensed by subjecting the surface of the delaminated layer to thermal oxidation can be 900° C. or more.

If a thermal oxidation temperature at the surface of the delaminated layer is 900° C. or more as described above, generation of Ge precipitation can be prevented at the interface between the oxide film and the SiGe layer.

Moreover, it is preferable that a temperature when a Si layer of the surface of the delaminated layer is made to be a thermal oxide film by subjecting the surface to thermal oxidation is 1000° C. or less.

If a temperature when a Si layer of the surface of the delaminated layer is made to be a thermal oxide film by subjecting the surface to thermal oxidation is 1000° C. or less, generation of defects such as OSF (Oxidation induced Stacking Fault) can be prevented when damage by the ion implantation which remains in the Si layer of a surface of the delaminated layer is introduced into the thermal oxide film to be formed.

According to the present invention, if a protective film is formed on a surface of a SiGe layer and then the protective film is cleaned with a first cleaning liquid so that the protective film remains, the SiGe layer is protected during the cleaning and roughening of the surface can be prevented. In addition, because the protective film is slightly etched and removed with the first cleaning liquid, cleaning effect can be high and bonding force of the bonded plane can be prevented from lowering.

Moreover, if the multilayer substrate cleaned with the first cleaning liquid is cleaned with a second cleaning liquid which is capable of etching the protective film and which has a smaller etching rate for the protective film than the first cleaning liquid so that the protective film is removed and that the SiGe layer is exposed, the SiGe layer is etched with the second cleaning liquid having a small etching rate so that roughening of the surface is not caused. Therefore, roughening of a surface of the SiGe layer to be a bonded plane is prevented and at the same time the cleaning effect can be very high, thereby bonding force of the bonded plane can be prevented from lowering.

Furthermore, if a surface of the SiGe layer or the protective film cleaned by using the cleaning method as described above and a surface of another substrate are bonded directly or through an insulator film, lowering of bonding force due to roughening of the bonded plane can be prevented, troubles such as delamination at the bonded plane do not happen in subsequent steps, and improvement of process yield of producing a bonded substrate is achieved.

Moreover, according to the present invention, if a $Si_{1-X}Ge_X$ layer (0<X<1) and a protective layer are formed in order on a surface of a silicon single crystal wafer to be a bond wafer, at least one kind of a hydrogen ion and rare gas ions is implanted through the protective layer thereby to form an ion implanted layer and then the bond wafer formed with the ion implanted layer is cleaned, roughening of the surface of the $Si_{1-X}Ge_X$ layer by cleaning can be prevented with the protective layer and at the same time organic matter or metal impurities adhering to the implanted surface when ions are implanted can be removed. Therefore, voids or blisters can be prevented from being generated at the bonded plane after the delaminating heat treatment. Moreover, if a surface of the protective layer of the bond wafer after being cleaned and a base wafer are closely superposed through an insulator film or directly, it becomes easy to cause slipping on the interface between the protective layer and the base wafer, and a condensation SiGe layer formed by Ge being condensed at the $Si_{1-X}Ge_X$ layer when the surface of the delaminated layer is subjected to thermal oxidation thereby to form a thermal oxide film becomes a layer that generation of dislocations is suppressed and at the same time lattice relaxation is performed sufficiently. Therefore, epitaxial growth of a strained Si layer of good quality can be performed on the surface.

BEST MODE FOR CARRYING OUT THE INVENTION

Figure 1:
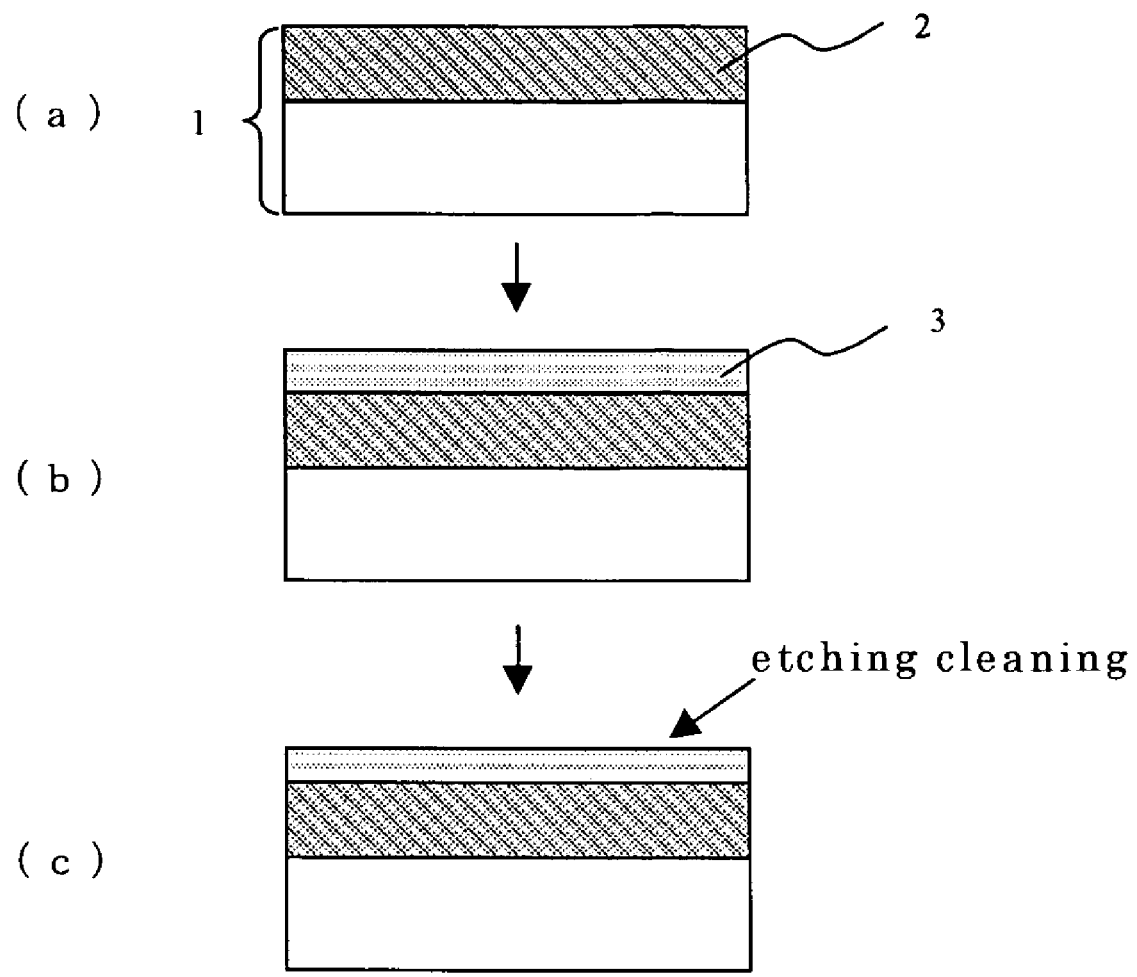
FIG. 1 is a view showing an example of steps for cleaning a multilayer substrate according to the present invention.

Hereinafter, embodiments of the present invention will be explained. However, the present invention is not limited thereto.

As mentioned above, when a strained Si layer is formed, in the case that a method for bonding a surface of a SiGe layer formed on a silicon substrate to be a bond wafer to another silicon substrate through an oxide film, in order to remove particles or contaminants on surfaces of the bonded plane before bonding, the SiGe layer is subjected to SC-1 cleaning and such which is used for cleaning of a general silicon substrate. In this case, because Ge etching rate is larger than Si etching rate, surface roughness of the SiGe layer after being cleaned is rougher than that in the case that a silicon surface is subjected to SC-1 cleaning, and the surface roughness becomes larger along with Ge concentration being higher. Because the strain of the strained Si layer can be larger as the Ge concentration is higher, it is desirable that the Ge concentration of the SiGe layer is high. However, surface roughness after the cleaning becomes further larger. In a bonded substrate that is produced by bonding a surface of the surface-roughened SiGe layer to a silicon substrate to be a base wafer through an oxide film, a bonding force of the bonded plane lowers. For example, thereafter, bonding defects are caused at the bonded plane in a step of thinning a silicon substrate of the bond wafer and such, and lowering of process yield of producing bonded substrates is provoked.

With respect to this, the present inventors have found that if a protective film is formed on a surface of the SiGe layer and then the protective film is etched and cleaned with a first cleaning liquid so that the protective film remains, roughening of the surface can be prevented because the SiGe layer is protected during cleaning. And additionally because the protective film is slightly etched and removed with the first cleaning liquid, the cleaning effect can be high and bonding force of the bonded plane can be prevented from lowering. Moreover, if the multilayer substrate cleaned with the first cleaning liquid is cleaned with a second cleaning liquid which is capable of etching the protective film and which has a smaller etching rate for the protective film than the first cleaning liquid so that the protective film is removed and that the SiGe layer is exposed, the SiGe layer can be etched with the second cleaning liquid having a small etching rate so that roughening of the surface is not caused. Therefore, roughening of a surface of the SiGe layer to be a bonded plane is prevented and at the same time the cleaning effect can be drastically high, thereby bonding force of the bonded plane can be prevented from lowering.

On the other hand, as mentioned above, in the case that an SOI wafer is produced by using an ion implantation delamination method, it is contaminated by organic matter or metal impurities adhering to a surface of a $Si_{1-X}Ge_X$ layer when ions are implanted. Furthermore, roughening of the surface is also caused on the surface of the $Si_{1-X}Ge_X$ layer, and in the case that a surface of the $Si_{1-X}Ge_X$ layer and a base wafer are closely superposed through an oxide film after the ion implantation, there has been a problem that bonding defects such as voids or blisters are generated in the bonded plane after the delaminating heat treatment.

However, if a surface of the $Si_{1-X}Ge_X$ layer is subjected to SC-1 cleaning for removing the organic matter or metal impurities, surface roughness of the $Si_{1-X}Ge_X$ layer after the cleaning becomes further larger by the above-described reason. There has been a problem that when a surface of the $Si_{1-X}Ge_X$ layer or the like after being cleaned and a base wafer are closely superposed through an oxide film, bonding defects such as voids or blisters are generated in the bonded plane after the delaminating heat treatment.

Moreover, in the case that the $Si_{1-X}Ge_X$ layer is bonded to a base wafer through a Si layer or an insulator layer thereon, lattice relaxation within the condensation SiGe layer when Ge concentration is enhanced in the $Si_{1-X}Ge_X$ layer is not performed sufficiently. Therefore, dislocations are generated and the strained Si layer lying directly thereon becomes also bad in crystallinity.

With respect to this, the present inventors have found that if a protective layer is formed on a surface of a $Si_{1-X}Ge_X$ layer (0<X<1), at least one kind of a hydrogen ion and rare gas ions is implanted through the protective layer thereby to form an ion implanted layer and then the bond wafer formed with the ion implanted layer is cleaned, roughening of the surface of the $Si_{1-X}Ge_X$ layer by cleaning can be prevented with the protective layer and at the same time organic matter or metal impurities adhering to the implanted surface when ions are implanted can be removed. Therefore, voids or blisters can be prevented from being generated at the bonded plane after delaminating heat treatment. Moreover, if a surface of the protective layer of the bond wafer after being cleaned and a base wafer are closely superposed through an insulator oxide film or directly, it becomes easy to cause slipping on the interface between the protective layer and the base wafer, and in a condensation SiGe layer formed by Ge being condensed at the $Si_{1-X}Ge_X$ layer when the surface of the delaminated layer is subsequently subjected to thermal oxidation thereby to form a thermal oxide film, generation of dislocations is suppressed and at the same time lattice relaxation is performed sufficiently. Thus, the present invention has been accomplished.

Hereinafter, embodiments of the present invention will be explained by using drawings.

FIG. 1 is a view showing an example of steps for cleaning a multilayer substrate according to the present invention.

First, a multilayer substrate 1 having a SiGe layer 2 as an uppermost surface layer is prepared as in FIG. 1(*a*). This multilayer substrate 1 is not particularly limited as long as having a SiGe layer as an uppermost surface layer. However, such a substrate that epitaxial growth of a SiGe layer is performed on a surface of the silicon single crystal wafer can be used.

Next, as shown in FIG. 1(*b*), a protective film 3 is formed on the SiGe layer 2. As the protective film 3, for example, a silicon single crystal, a silicon polycrystal, an amorphous silicon, a silicon oxide, and so forth can be used.

And, as shown in FIG. 1(*c*), the protective film 3 is cleaned with a first cleaning liquid. The cleaning can be performed, for example, by immersing the multilayer substrate 1 in the first cleaning liquid. The first cleaning liquid can etch the protective film 3 and, for example, if the protective film 3 consists of silicon, a SC-1 cleaning liquid consisting of a mixed aqueous solution of $NH_4OH$ and $H_2O_2$ can be used as the first cleaning liquid. Because the protective film 3 is slightly etched by the cleaning, the cleaning effect can be high. In this case, by performing the cleaning so that the protective film 3 remains, a SiGe layer 2 can be protected and roughening of the surface can be prevented. Therefore, bonding force of the bonded plane can be prevented from lowering.

In this case, it is preferable that the cleaning is performed so that a thickness of the remaining protective film 3 is from 1 nm to 100 nm. If a thickness of the remaining protective film 3 is 1 nm or more, it doesn't happen that a part of the SiGe layer 2 is exposed on the surface thereof and roughening of the surface is partially caused during the cleaning, and the thickness is sufficient for protecting the SiGe layer 2 from roughening of the surface by cleaning. Moreover, if the thickness is 100 nm or less, also in the case that a bonded SOI wafer having a strained Si layer is produced by being bonded to a base wafer having an oxide film on a surface thereof at a later step, a thickness from the strained Si layer to the oxide film can be sufficiently thin. The lowering effect of stray capacitance that is an advantage of SOI structure can be sufficient.

In this case, the thickness of the remaining protective film 3 can be easily adjusted by adjusting composition or temperature of the first cleaning liquid or the cleaning time. For example, if the temperature of the cleaning liquid is low and the cleaning time is shortened, etching amount in the cleaning can be small. By adjusting these conditions, the thickness of the remaining protective film 3 can be, for example, from 1 nm to 100 nm.

Figure 2:
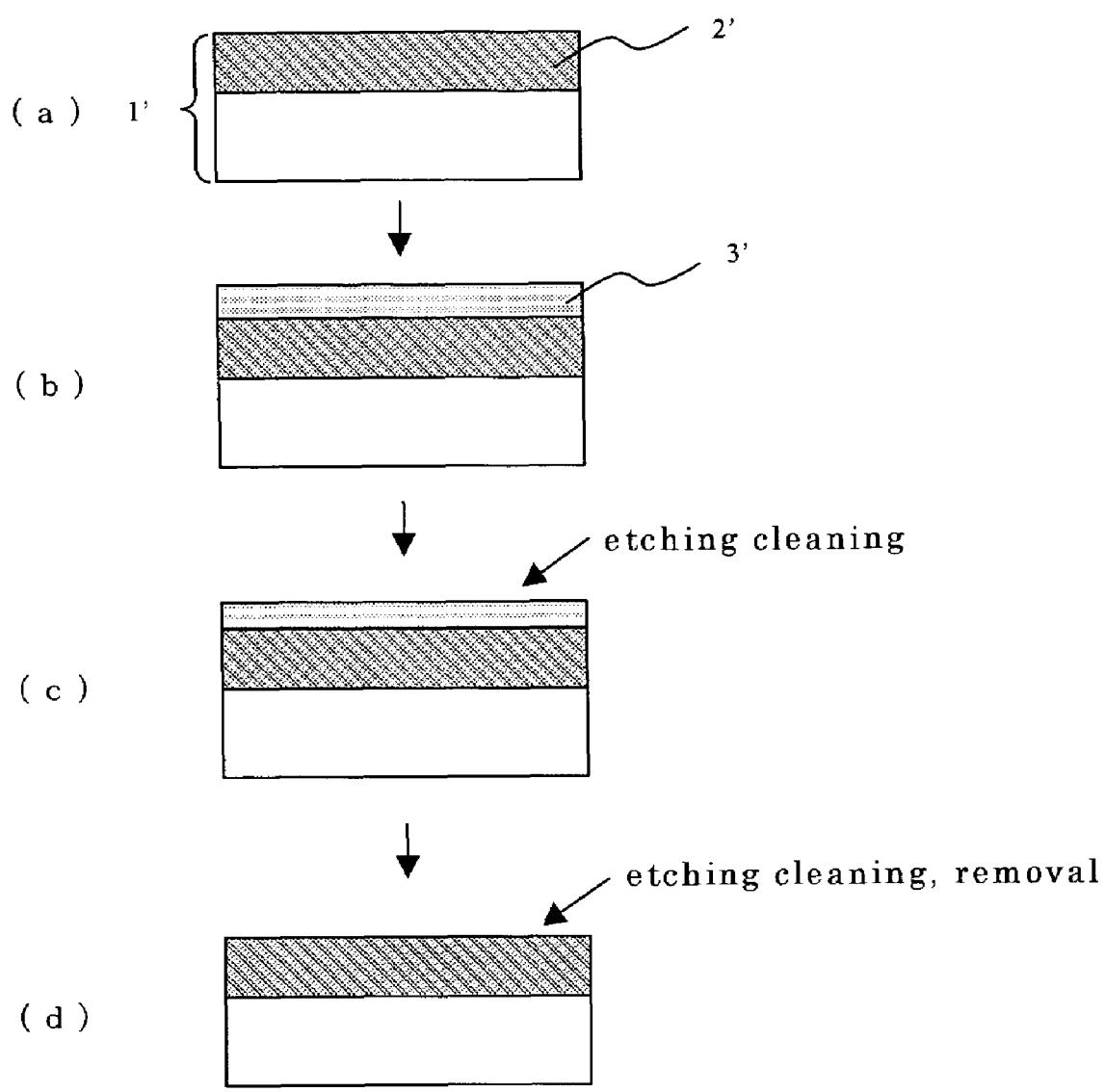
FIG. 2 is a view showing another example of steps for cleaning a multilayer substrate according to the present invention.

FIG. 2 is a view showing another example of steps for cleaning a multilayer substrate according to the present invention.

FIG. 2(*a*)-(*c*) can be performed in the manner similar to the steps as shown in FIG. 1(*a*)-(*c*). Then, as in FIG. 2(*d*), cleaning is performed with a second cleaning liquid so that a remaining protective film 3' after the cleaning with a first cleaning liquid is removed and that a SiGe layer 2' is exposed. The cleaning can be performed, for example, by immersing the multilayer substrate 1' in the second cleaning liquid. The second cleaning liquid is capable of etching the protective film 3' and has a smaller etching rate for the protective film than the first cleaning liquid and, for example, if the protective film 3' consists of silicon, a SC-1 cleaning liquid consisting of a mixed aqueous solution of $NH_4OH$ and $H_2O_2$ adjusted to have a slower etching rate than the first cleaning liquid may be used as the second cleaning liquid. By performing the cleaning with the second cleaning liquid so that the protective film 3' is removed and that the SiGe layer 2' is exposed, the SiGe layer 2' can be etched and cleaned so that roughening of the surface is not caused. Therefore, roughening of a surface of the SiGe layer 2' to be a bonded plane is prevented and at the same time the cleaning effect can be very high, therefore bonding force of the bonded plane can be certainly prevented from lowering.

The second cleaning liquid has a smaller etching rate than the first cleaning liquid. For example, if a temperature of the second cleaning liquid is lower than a temperature of the first cleaning liquid, the etching rate of the second cleaning liquid can be easily made to be small so that roughening of the surface of the SiGe layer 2' is not caused. Of course, the etching rate may be small by adjusting composition of the second cleaning liquid.

Figure 3:
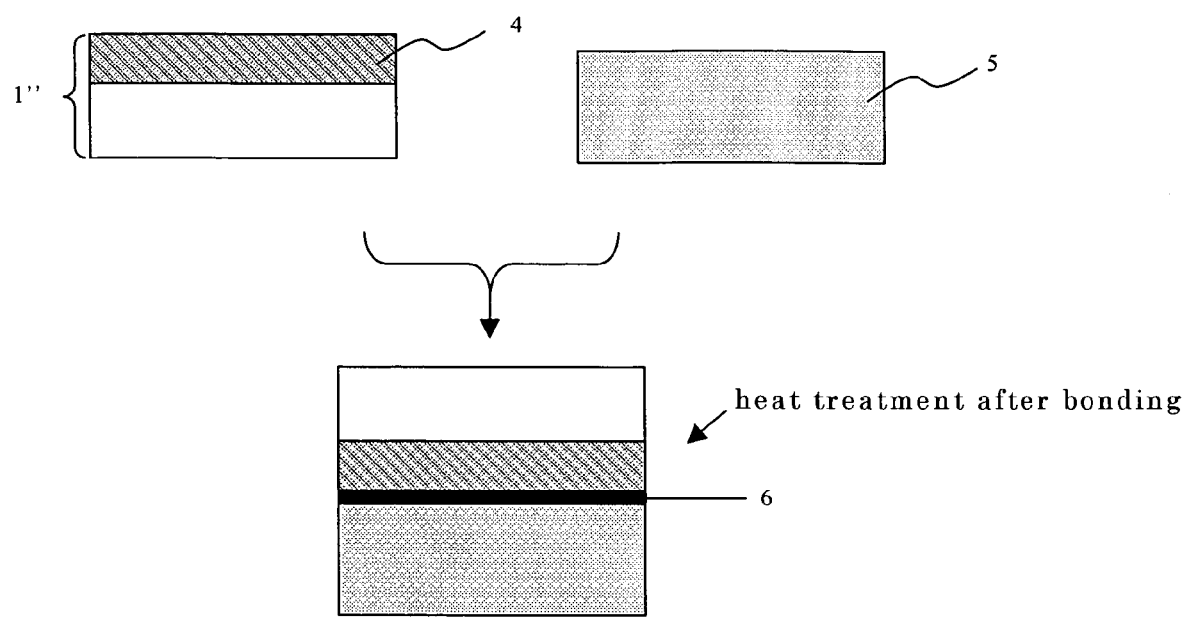
FIG. 3 is a view showing steps for bonding a multilayer substrate according to the present invention.

FIG. 3 is a view showing an example of steps for bonding a multilayer substrate according to the present invention. First, a multilayer substrate 1" cleaned by using the above-mentioned cleaning method is prepared. The uppermost surface layer 4 of the multilayer substrate 1" is the SiGe layer or the protective film remaining slightly thereon and has a surface in which roughening of the surface is prevented by the cleaning. Moreover, another substrate 5 (a base wafer) to be bonded to the multilayer substrate 1" is prepared. The base wafer 5 may be, for example, a silicon single crystal wafer that an oxide film is formed on a surface thereof, or an insulator wafer such as quartz, silicon carbide, alumina, or diamond. It is preferable that each of them has a surface that is cleaned in order to prevent bonding force from lowering in a bonded plane thereof to the multilayer substrate 1" and that has a surface in which roughening of the surface is small.

Next, the multilayer substrate 1" and a base wafer 5 are bonded. The bonding can be performed at a room temperature and then binding force is enhanced by heat-treating, for example, at about 200-1200° C. in a nitrogen atmosphere. If the multilayer substrate 1" is bonded to the base wafer 5 as mentioned above, bonding force can be prevented from lowering by roughening of the surface or contamination in the bonded plane. Therefore, troubles such as delamination at the bonded plane do not happen in subsequent steps. Thereby, improvement of process yield of producing a bonded substrate is achieved.

Figure 4:
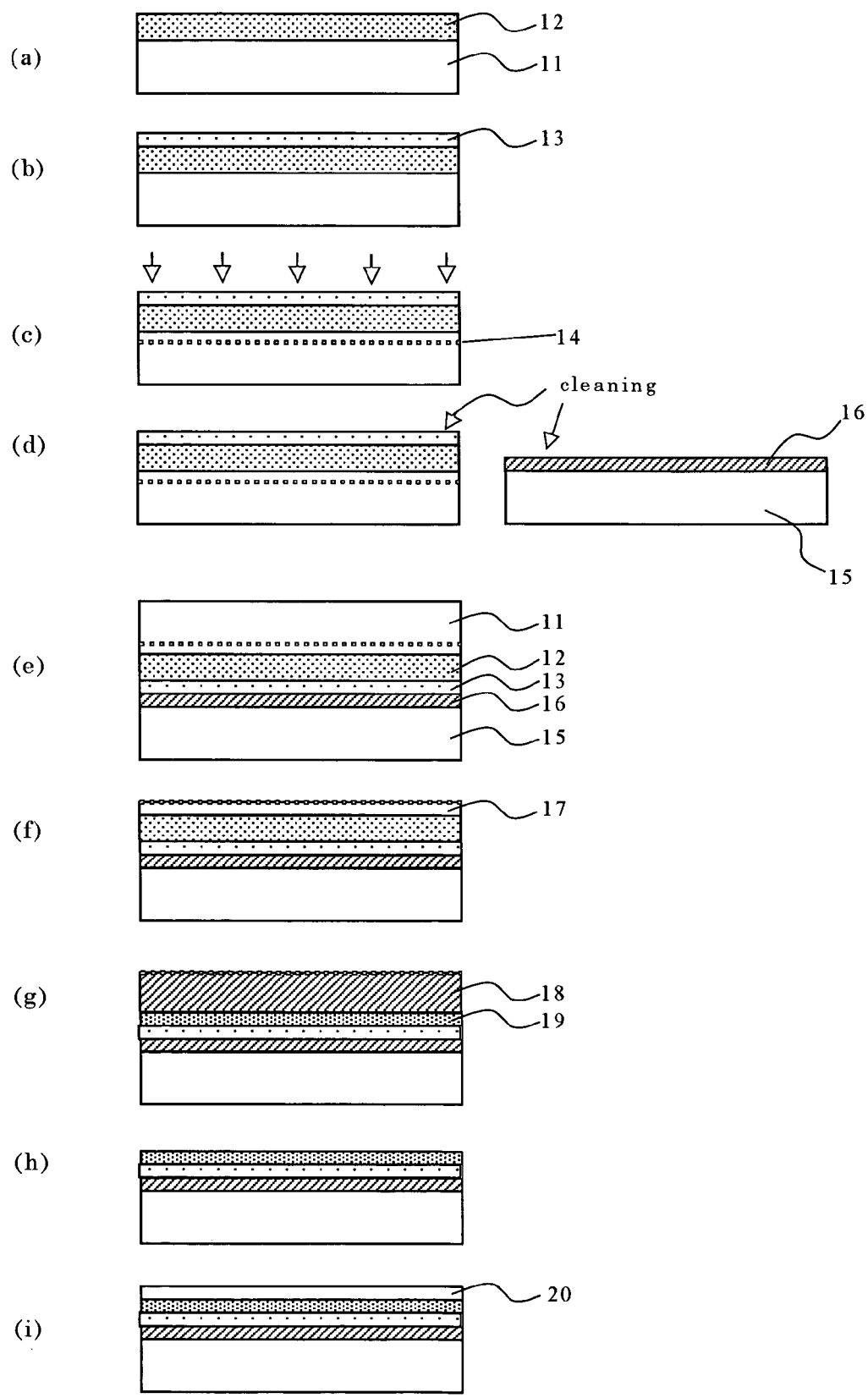
FIG. 4 is a view showing an example of steps for producing a bonded wafer according to the present invention.

FIG. 4(*a*)-(*i*) is a view showing an example of steps for producing a bonded wafer according to the present invention.

First, as in FIG. 4(*a*), a $Si_{1-X}Ge_X$ layer 12 is grown at a thickness of about 10-500 nm on a silicon single crystal wafer 11 by vapor growth method. In this case, X in the $Si_{1-X}Ge_X$ layer 12, or Ge composition, can be constant. For example, if a $Si_{1-X}Ge_X$ layer is formed as a gradient composition layer that X=0 in early phase of the growth and the X is gradually increased toward a surface, dislocations generated in the $Si_{1-X}Ge_X$ layer can be effectively suppressed. In addition, for suppressing dislocations, X<0.2 is preferable, and if X≦0.15, dislocations can be sufficiently suppressed.

The vapor growth can be performed by CVD (Chemical Vapor Deposition) method, MBE (Molecular Beam Epitaxy) method, or the like. In the case of the CVD method, for example, a mixed gas of $SiH_4$ or $SiH_2Cl_2$ and $GeH_4$ can be used as a material gas. $H_2$ can be used as a carrier gas. As conditions for the growth, for example, temperature may be 600-1000° C. and pressure 100 Torr or less.

Next, as shown in FIG. 4(*b*), a protective layer 13 is formed on a surface of the grown $Si_{1-X}Ge_X$ layer 12. As the protective layer 13, a silicon single crystal layer, an amorphous silicon layer, a polysilicon layer, a silicon oxide film layer, or the like can be used. Any one of these protective layers can be formed by vapor growth method. If the protective layer is a silicon oxide film layer, it can be formed by thermal oxidation and can be used as a BOX (Buried OXide film) layer after the bonding. Moreover, in the case that the protective layer is a silicon single crystal layer, it can be used as a SiGe layer in which Ge is condensed in a later step. It is preferable that a thickness of the protective layer 13 is an extent that slipping is sufficiently caused at the bonded plane. For example, if the protective layer 13 is a silicon oxide film layer, a thickness may be 100 nm or less, preferably, 50 nm or less.

And, as shown in FIG. 4(*c*), at least one kind of a hydrogen ion and rare gas ions is implanted through the protective layer 13 at a predetermined dose amount thereby to form an ion implanted layer 14 inside the silicon single crystal wafer 11. In this case, because the ion-implanted depth depends on magnitude of the implantation energy, the implantation energy may be set so as to achieve the predetermined implantation depth. In addition, the ion implantation depth in the present invention may be to the inside of the silicon single crystal wafer 11 that is a bond wafer, to the interface of the bond wafer and the $Si_{1-X}Ge_X$ layer 12, or to the inside of the $Si_{1-X}Ge_X$ layer 12 as mentioned later. In brief, as a delaminated layer after bonding, at least one part of the $Si_{1-X}Ge_X$ layer 12 may be transferred to the base wafer.

Moreover, if ion implantation is performed from a direction perpendicular to a surface of the protective layer 13, channeling can be prevented and in-plane uniformity of the ion implantation depth can be enhanced. Therefore, the ion implanted layer 14 of good quality can be formed. In particular, if the protective layer 13 is a silicon oxide film layer, an amorphous silicon layer, a polysilicon layer, or the like, channeling can be prevented effectively from being caused.

Next, as shown in FIG. 4(*d*), by cleaning the bond wafer, a surface of the protective layer 13 is cleaned, and organic matter and metal impurities on the surface are removed. The cleaning may be performed in the same manner as the cleaning of the protective film as shown in FIG. 1(*c*) that is an example of a cleaning step of multilayer substrate according to the present invention as described above. The cleaning can be performed by SC-1 cleaning in the same conditions that are generally used in cleaning of a Si wafer, and further SC-1 cleaning and SC-2 cleaning (cleaning with a mixed aqueous solution of HCl and $H_2O_2$) can be appropriately combined and performed. Moreover, by combining a sulfuric acid-hydrogen peroxide solution cleaning (cleaning with a mixed aqueous solution of $H_2SO_4$ and $H_2O_2$) or an ozone water cleaning with these cleanings, removing effect of organic matter can be enhanced. In the case that the $Si_{1-X}Ge_X$ layer 12 is exposed on the surface, if general cleaning of a silicon substrate as described above is performed, roughening of the surface is caused on the $Si_{1-X}Ge_X$ layer 12. However, roughening of the surface is not caused in the present invention because the $Si_{1-X}Ge_X$ layer 12 is protected by the protective layer 13. Therefore, generation of bonding defects such as voids or blisters in subsequent steps can be prevented.

In this case, a base wafer 15 that is separately prepared may be subjected to the similar cleaning. If the base wafer 15 to be prepared is a silicon single crystal wafer or the like, a silicon oxide film 16 is formed on a surface thereof. The silicon oxide film 16 to be formed is finally to become a BOX layer when a bonded wafer is completed. Therefore, for obtaining the film of high quality, it is preferable that the film is formed by thermal oxidation. Moreover, in the case that as the base wafer 15, an insulator wafer such as quartz, silicon carbide, alumina, or diamond is used, the silicon oxide film 16 does not always have to be formed on the surface. However, a silicon oxide film can be formed by a CVD method or the like.

Next, as shown in FIG. 4(*e*), a surface of the protective layer 13 and a surface of the base wafer 15 are superposed at a room temperature through the silicon oxide film 16. If the base wafer 15 is an insulator wafer such as quartz, the protective layer 13 and the base wafer 15 may be superposed directly. In this case, because the interface between the protective layer 13 and the silicon oxide film 16 or the insulator base wafer 15 becomes a bonded plane, slipping is easily caused at the bonded plane, and lattice relaxation of a condensation SiGe layer 19 in which Ge concentration is enhanced by formation of a thermal oxide film 18 at the later step is easily performed. Thereby generation of dislocations in the condensation SiGe layer 19 can be suppressed.

Next, as shown in FIG. 4(*f*), heat treatment (delaminating heat treatment), for example, at 500° C. or more is carried out and thereby delamination is performed so that the ion implanted layer 14 becomes a cleavage plane. Thereby, a part of a silicon single crystal wafer 17, the $Si_{1-X}Ge_X$ layer 12, and the protective layer 13 are transferred to the base wafer side as a delaminated layer.

In addition, as pretreatment of the step of closely superposing a surface of the protective layer 13 and a surface of the base wafer 15 as shown in FIG. 4(*e*), if the surfaces provided for closely superposing the both wafers are subjected to plasma treatment and thereby the adhesion strength is enhanced, it is possible that delamination can be mechanically performed at the ion implanted layer 14 without performing the delaminating heat treatment after the closely superposing.

Next, as shown in FIG. 4(g), the surface of the delaminated layer transferred to the base wafer side is subjected to thermal oxidation and thereby a thermal oxide film 18 is formed. Thermal oxidation in this case is performed against the silicon layer 17 and a part of a $Si_{1-X}Ge_X$ layer 12 of the delaminated layer. In this case, if a part of the $Si_{1-X}Ge_X$ layer 12 of the delaminated layer is subjected to thermal oxidation, Ge is hardly taken in the oxide film. Therefore, Ge existing in the thermally oxidized part transfers to a part that is not thermally oxidized, and a condensation SiGe layer 19 in which Ge is condensed is formed. Moreover, in the case that the protective layer 13 is a silicon single crystal layer, the protective layer 13 can be also used as a part of the SiGe layer 19 in which Ge is condensed. As described above, because Ge concentration in the condensation SiGe layer 19 can be enhanced by oxidizing the $Si_{1-X}Ge_X$ layer 12, stronger strain (compression strain) is generated in the condensation SiGe layer 19. However, because a bonded interface in which chemical bond is not perfect exists near the condensation SiGe layer 19, slipping is generated so as to relax the strain of the condensation SiGe layer 19 in the interface, and lattice relaxation is accomplished with suppressing generation of dislocations in the condensation SiGe layer 19.

In this case, because damage caused by the ion implantation remains in the surface of the silicon layer 17, OSF are easily generated by subjecting a surface of the delaminated layer directly to thermal oxidation at a higher temperature than 1000° C. Therefore, it is preferable that until the damaged layer is taken in by a thermal oxide film in the thermal oxidation of the silicon layer 17, the thermal oxidation is performed at a temperature of 1000° C. or less, preferably 950° C. or less. Alternatively, the thermal oxidation is performed after the delaminated surface is slightly polished (touch-polished).

On the other hand, in the case that the $Si_{1-X}Ge_X$ layer 12 is subjected to thermal oxidation, Ge is condensed in the condensation SiGe layer 19 by the thermal oxidation because Ge is hardly taken into the oxide film as described above. If the thermal oxidation temperature is less than 900° C., Ge precipitation becomes easily caused at the interface of the thermal oxide film 18 and the condensation SiGe layer 19. Therefore, it is desirable that the oxidation temperature is 900° C. or more, preferably 1000° C. or more. Moreover, it is possible that heat treatment under a non-oxidizing atmosphere such as Ar, $H_2$, and $N_2$ is added after the oxidation and thereby Ge is diffused so that Ge concentration in the depth direction becomes uniform.

That is, in the case that delamination is performed by forming an ion implanted layer inside the silicon single crystal wafer 11 and a surface of the delaminated layer is a silicon layer 17, the suitable steps is that thermal oxidation is performed at a temperature of 1000° C. or less, preferably 950° C. or less until the whole silicon layer 17 turns into thermal oxide film, and then when the $Si_{1-X}Ge_X$ layer 12 existing at the lower part of the silicon layer 17 is subjected to thermal oxidation, oxidation is performed at a temperature of 900° C. or more, preferably 1000° C. or more.

Next, as shown in FIG. 4(h), the formed thermal oxide film 18 is removed and the lattice-relaxed condensation SiGe layer 19 is exposed. For removing the thermal oxide film, a HF aqueous solution can be used.

Last, as shown in FIG. 4(i), epitaxial growth of the silicon single crystal layer 20 is performed by a vapor growth method on a surface of the exposed condensation SiGe layer 19. The epitaxial growth can be performed by CVD method, MBE method, or the like. In the case of CVD method, for example, $SiH_4$ or $SiH_2Cl_2$ can be used as a material gas. As conditions of the growth, temperature may be 600-1000° C. and pressure 100 Torr or less. The formed silicon single crystal layer 20 becomes a strained Si layer having tensile strain inside by difference in lattice constant from the condensation SiGe layer 19 that is the lower layer thereof. Because it is formed on the condensation SiGe layer 19 of good quality having few dislocations, it becomes a strained Si layer of good quality. It is preferable that a thickness of the silicon single crystal layer 20 to be epitaxially grown is about 10-50 nm for ensuring effective strain, workability and quality in device fabrication.

Next, FIG. 5(a)-(i) is a view showing another example of steps for producing a bonded wafer according to the present invention. Formation of a $Si_{1-X}Ge_X$ layer 12' on a surface of the silicon single crystal wafer 11' and formation of a protective layer 13' in FIGS. 5(a) and (b) can be performed with steps similar to those in FIGS. 4(a) and (b).

Figure 5:
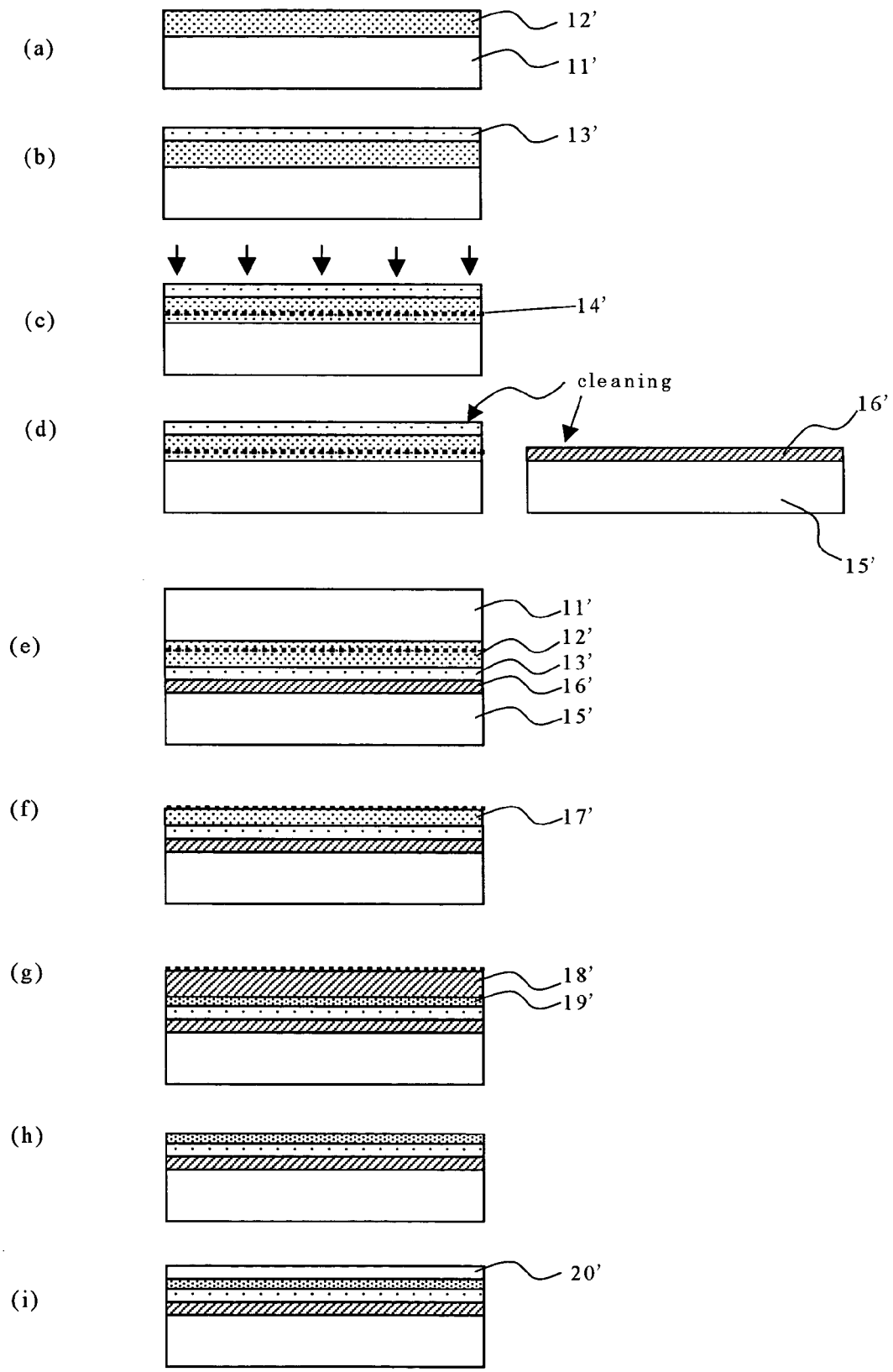
FIG. 5 is a view showing another example of steps for producing a bonded wafer according to the present invention.

Next, as shown in FIG. 5(c), at least one kind of a hydrogen ion and rare gas ions is implanted through the protective layer 13' at a predetermined dose amount thereby to form an ion implanted layer 14' inside the $Si_{1-X}Ge_X$ layer 12'. In this case, the ion implanted layer 14' may be formed in an interface between the $Si_{1-X}Ge_X$ layer 12' and the silicon single crystal wafer 11'. Because an ion-implantation depth depends on magnitude of the implantation energy, the implantation energy may be set so as to achieve a desired implantation depth.

Next, as shown in FIGS. 5(d) and (e), the surface of the protective layer 13' is cleaned to remove organic matter or metal impurities on the surface. The cleaning may be in a manner similar to the above-mentioned cleaning of a protective film as shown in FIG. 1(c). A base wafer 15' that is separately prepared is subjected to the similar cleaning. Then, the surface of the protective layer 13' and a surface of the base wafer 15' are closely superposed through a silicon oxide film 16' or directly at a room temperature. These steps can be performed according to the steps similar to those in FIGS. 4. (d) and (e).

Next, as shown in FIG. 5(f), heat treatment (delaminating heat treatment), for example, at 500° C. or more is carried out and thereby delamination is performed so that the ion implanted layer 14' becomes a cleavage plane. Thereby, a part or the whole of the $Si_{1-X}Ge_X$ layer 17', and the protective layer 13' are transferred to the base wafer side. In addition, also in this case, as a pretreatment of the step of closely superposing a surface of the protective layer 13' and a surface of the base wafer 15', the surfaces provided for closely superposing the both wafers is plasma-treated to enhance the adhesion strength, thereby delamination may be mechanically performed at the ion implanted layer 14' without performing the delaminating heat treatment.

Next, as shown in FIG. 5(g), a surface of the $Si_{1-X}Ge_X$ layer 17' transferred to the base wafer side is subjected to thermal oxidation and thereby a thermal oxide film 18' is formed. In this case, by the formation of the thermal oxide film 18', the condensation SiGe layer 19' in which Ge is condensed. Moreover, in the case that the protective layer 13' is a silicon single crystal layer, the protective layer 13' can be also used as a part of the SiGe layer 19' in which Ge is condensed. Stronger strain (compression strain) is generated in the condensation SiGe layer 19'. However, because a bonded interface exists near the condensation SiGe layer 19', and slipping is generated so as to relax the strain of the condensation SiGe layer 19' in the interface, thereby lattice relaxation is accomplished with suppressing generation of dislocations in the condensation SiGe layer 19'.

Also, in this case, Ge is condensed in the condensation SiGe layer 19' by the thermal oxidation because Ge is hardly taken into the oxide film as described above. If the thermal oxidation temperature is less than 900° C., Ge precipitation becomes easily caused at the interface of the thermal oxide film 18' and the condensation SiGe layer 19'. Therefore, it is desirable that the oxidation temperature is 900° C. or more, preferably 1000° C. or more.

Moreover, it is desirable that after touch-polishing a damaged layer of a surface of the transferred $Si_{1-X}Ge_X$ layer 17', the transferred $Si_{1-X}Ge_X$ layer 17' is subjected to thermal oxidation at an oxidation temperature of 900° C. or more, preferably 1000° C. or more, and thereby Ge condensation is performed. In this case, there is not a Si layer on a surface of the delaminated layer, and a problem that OSF are generated is not caused. Therefore, heat treatment may be immediately performed at a temperature of 1000° C. or more.

Next, as shown in FIG. 5(h), the formed thermal oxide film 18' is removed and the lattice-relaxed condensation SiGe layer 19' is exposed. For removing the thermal oxide film 18', a HF aqueous solution can be used.

Last, as shown in FIG. 5(i), epitaxial growth of a silicon single crystal layer 20' is performed by vapor growth method on a surface of the exposed condensation SiGe layer 19'. The silicon single crystal layer 20' formed as described above becomes a strained Si layer having tensile strain inside by difference in lattice constant from the condensation SiGe layer 19' that is the lower layer thereof. Because it is formed on the condensation SiGe layer 19' of good quality having few dislocations, it becomes a strained Si layer of good quality. It is preferable that a thickness of the silicon single crystal layer 20' to be epitaxially grown is about 10-50 nm for ensuring effective strain, workability and quality in device fabrication.

Hereinafter, the present invention is explained in detail according to Examples and Comparative Examples. However, the present invention is not limited to these.

Examples 1 and 2

Comparative Examples 1-3

A total of 4 kinds of sample wafers were prepared: on a surface (a mirror-polished surface) of a silicon single crystal wafer having a diameter of 200 mm, a SiGe layer with a Ge concentration of 5% or 15% is deposited only by 50 nm by epitaxial method to be an uppermost surface layer as shown in Table 1 as described below (Comparative Examples 1 and 2), and as a protective film, a protective silicon layer is further deposited thereon only by 20 nm by epitaxial method to be an uppermost surface layer (Examples 1 and 2). Moreover, for a reference, a general mirror-polished silicon single crystal wafer without the above-described epitaxial layer being formed (Comparative Example 3) was prepared.

The surface of each uppermost surface layer of the five kinds of the sample wafers and silicon single crystal base wafers that were separately prepared (having a thermal oxide film with a thickness of 400 nm) were subjected to SC-1 cleaning in conditions as described below. Then bonding was performed at a room temperature and heat treatment was performed at 350° C. for 2 hours (in a nitrogen atmosphere). Then, surface energy in each bonded interface that is proportional to bonding force was evaluated by a razor-blade insertion method.

TABLE 1

|  | SiGe Layer (50 nm) | Protective Si Layer (20 nm) | Wafer Structure (from Surface) |
|---|---|---|---|
| Example 1 | Existence: Ge 5% | Existence | Protective Si/SiGe/Si Wafer |
| Example 2 | Existence: Ge 15% | Existence | Protective Si/SiGe/Si Wafer |
| Comparative Example 1 | Existence: Ge 5% | None | SiGe/Si Wafer |
| Comparative Example 2 | Existence: Ge 15% | None | SiGe/Si Wafer |
| Comparative Example 3 | None | None | Si Wafer |

Figure 6:
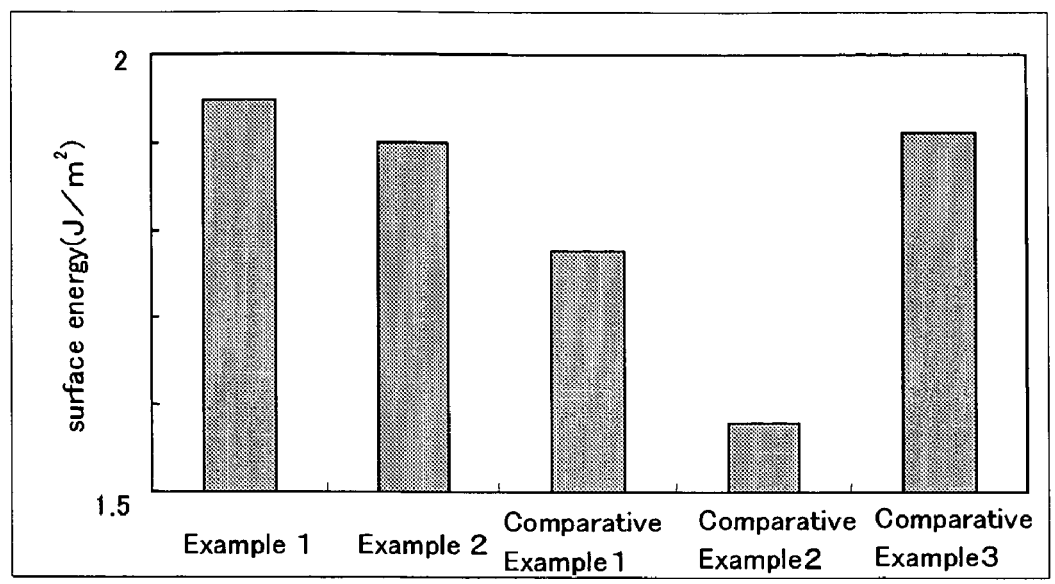
FIG. 6 is a view showing surface energy values when each sample wafer of Examples 1, 2 and Comparative Examples 1-3 and a base wafer is bonded.

<SC-1 cleaning conditions>
Composition 29 wt % $NH_4OH$:30 wt % $H_2O_2$:$H_2O$ = 1:1:5 (capacity ratio)
Liquid Temperature 80° C.
Cleaning Time 3 minutes In Table 2 and FIG. 6, results of measuring an RMS (Root Mean Square) value of surface roughness of 1-μm-square and 10-μm-square in an uppermost surface layer near a central portion of each sample wafer after the SC-1 cleaning by AFM (Atomic Force Microscope), and results of measuring the surface energy by a razor-blade insertion method in the case of bonding each said sample wafer and a base wafer are shown. Moreover, a film-thickness of an uppermost surface layer of each said sample wafer before and after the SC-1 cleaning was measured, and results of calculating etching amount of the uppermost surface layer by the cleaning are shown in Table 3.

TABLE 2

|  | Surface Roughness after the Cleaning (RMS value) (nm) | | Surface Energy |
|---|---|---|---|
|  | 1-μm-square | 10-μm-square | (J/m$^2$) |
| Example 1 | 0.129 | 0.087 | 1.949 |
| Example 2 | 0.144 | 0.087 | 1.9 |
| Comparative Example 1 | 0.157 | 0.103 | 1.777 |
| Comparative Example 2 | 0.209 | 0.121 | 1.578 |
| Comparative Example 3 | — | — | 1.911 |

TABLE 3

|  | Film-Thickness of Surface Layer (nm) | | Etching |
|---|---|---|---|
|  | Before the Cleaning | After the Cleaning | Amount (nm) |
| Example 1 | 18.93 | 17.39 | 1.54 |
| Example 2 | 20.53 | 18.72 | 1.81 |
| Comparative Example 1 | 46.43 | 43.99 | 2.44 |
| Comparative Example 2 | 50.11 | 45.23 | 4.88 |

As shown in FIG. 2, with regard to the surface roughness after the cleaning, values of Examples 1 and 2 are smaller than that of Comparative Examples 1 and 2. For example, compared at the Ge concentration of 15%, the RMS value of 1-μm-square in Example 2 was 0.144 nm, and that in Comparative Example 2 was 0.209 nm, which was largely different from the former. From this result, it was found that roughening of the surface at the uppermost surface layer by the cleaning was prevented in Examples 1 and 2. Moreover, with regard to the surface energy, as shown in Table 2 and FIG. 6, values in Examples 1 and 2 were larger than those of Comparative Examples 1 and 2. For example, while it was 1.578 J/m$^2$ in Comparative Example 2, it was 1.9 J/m$^2$ in Example 2, which was an equivalent good value to 1.911 J/m$^2$ in the case of having no SiGe layer in Comparative Example 3. From these results, it was found that bonding force is prevented from lowering at a bonded plane by the cleaning.

Moreover, as shown in Table 3, even in the same cleaning conditions, etching amount of Examples 1 and 2 was smaller than that of Comparative Examples 1 and 2, and it was confirmed that etching rate is higher in samples having larger surface roughness.

Example 3

Comparative Example 4

Figure 7:
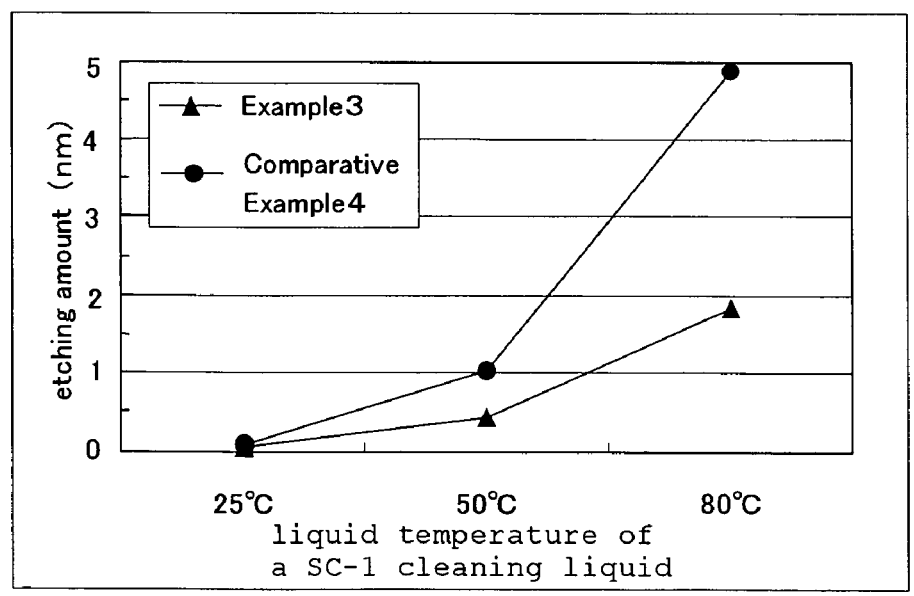
FIG. 7 is a view of showing etching amount of an outermost surface layer of each sample wafer of Example 3 and Comparative Example 4 in the case that liquid temperature of a SC-1 cleaning liquid is changed.

By using a sample wafer (Example 3) produced in the same conditions as in Example 2 as shown in Table 1 and a sample wafer (Comparative Example 4) produced in the same conditions as in Comparative Example 2, SC-1 cleaning was performed with changing only a liquid temperature in the above-mentioned SC-1 cleaning conditions to 25° C., 50° C., and 80° C., and thereby etching amount of the uppermost surface layer of each said sample wafer was compared. The results were shown in Table 4 and FIG. 7. From Table 4 and FIG. 7, etching amount in Example 3 was smaller than that in Comparative Example 4 at each liquid temperature. In addition, as the liquid temperature was higher, the difference between the two was larger. Moreover, by setting the liquid temperature of the SC-1 cleaning liquid to be lower, the etching amount can be smaller and it was confirmed that the etching amount can be adjusted by adjusting the liquid temperature.

TABLE 4

| | Etching Amount (nm) | | |
|---|---|---|---|
| | 25° C. | 50° C. | 80° C. |
| Example 3 | 0.06 | 0.41 | 1.81 |
| Comparative Example 4 | 0.09 | 1.01 | 4.88 |

Next, the sample wafer of Example 2 (the protective Si layer: 20 nm) was subjected to SC-1 cleaning at a liquid temperature of 80° C. for 10 minutes to remove a Si layer of the surface layer part by about 18 nm. Then, SC-1 cleaning was sequentially performed for 6 minutes at a liquid temperature of 50° C., lower temperature than before. And thereby, a SiGe layer was exposed. Surface roughness of the exposed SiGe layer was measured by AFM in the same manner as in Examples 1 and 2. Moreover, surface energy was measured by the same method as in Examples 1 and 2. As a result, surface roughness was 0.15 nm at 1-μm-square, 0.09 nm at 10-μm-square, respectively. Moreover, surface energy was 1.88 J/m$^2$ and the good result similar to the Example 2 was obtained.

Example 4

A $Si_{0.97}Ge_{0.03}$ layer (X=0.03) was grown by about 150 nm on a surface of a silicon single crystal wafer with a diameter of 200 mm by CVD method. And a protective layer of the silicon single crystal was formed by 50 nm on the surface of the $Si_{0.97}Ge_{0.03}$ layer by CVD method. Hydrogen ions (H$^+$) were ion-implanted through the protective layer of the silicon single crystal in conditions that the implantation energy was 40 keV and the dose amount was 5×10$^{16}$ atoms/cm$^2$, thereby an ion-implanted layer was formed on the surface layer part of the silicon single crystal wafer. After the hydrogen ion implantation, the surface of the protective layer of the silicon single crystal was subjected to cleaning with a sulfuric acid-hydrogen peroxide solution at 120° C. for 5 minutes, and SC-1 cleaning was sequentially performed at 80° C. for 3 minutes. Then, the wafer was closely superposed at a room temperature on a silicon single crystal base wafer having a thermal oxide film with 400 nm cleaned in the same conditions, and delaminating heat treatment was performed under an argon atmosphere at 500° C. for 30 minutes to carry out delamination at the ion implanted layer, and thereby the protective layer of the silicon single crystal, the $Si_{0.97}Ge_{0.03}$ layer, and a part of the silicon layer were transferred to the base wafer side. Next, thermal oxidation was performed at 950° C. and the silicon layer was thermally oxidized, and then the temperature was sequentially elevated to 1100° C. and a part of the $Si_{0.97}Ge_{0.03}$ layer was thermally oxidized. Thereby, a condensation SiGe layer in which Ge concentration was 20% or more was formed. Then, the oxide film was removed with 5% HF aqueous solution, the condensation SiGe layer was exposed, and the epitaxial growth of a silicon layer was performed on the surface by a thickness of 50 nm by CVD method.

20 bonded wafers produced as described above were prepared, and their surfaces were observed with eyes and the generation number of voids and blisters was counted. As a result, the generation number of voids and blisters per wafer was about 0.5.

Example 5

A $Si_{0.97}Ge_{0.03}$ layer (X=0.03) was grown by about 150 nm on a surface of a silicon single crystal wafer with a diameter of 200 mm by CVD method. An amorphous silicon protective layer was formed by 50 nm on the surface of $Si_{0.97}Ge_{0.03}$ layer. Hydrogen ions (H$^+$) were ion-implanted through the amorphous silicon protective layer in conditions that the implantation energy was 40 keV and the dose amount was 5×10$^{16}$ atoms/cm$^2$, thereby an ion-implanted layer was formed on the surface layer part of the silicon single crystal wafer. After the hydrogen ion implantation, the surface of the amorphous silicon protective layer was subjected to SC-1 cleaning at 80° C. for 3 minutes, SC-2 cleaning at 80° C. for 3 minutes, and SC-1 cleaning at 80° C. for 3 minutes in order. Then, it was closely superposed at a room temperature on a silicon single crystal base wafer having a thermal oxide film with 400 nm cleaned in the same conditions, and delaminating heat treatment was performed under an argon atmosphere at 500° C. for 30 minutes to carry out delamination at the ion implanted layer, thereby the amorphous silicon protective layer, the $Si_{0.97}Ge_{0.03}$ layer, and a part of the silicon layer were transferred to the base wafer side. Next, thermal oxidation was performed at 950° C. and the silicon layer was thermally oxidized. And then the temperature was sequentially elevated to 1100° C. and a part of the $Si_{0.97}Ge_{0.03}$ layer was thermally oxidized. Thereby, a condensation SiGe layer in which Ge concentration was 20% or more was formed. Then, the oxide film was removed with 5% HF aqueous solution, the condensation SiGe layer was exposed, and the epitaxial growth of a silicon layer was performed on the surface of the condensation SiGe layer by a thickness of 50 nm by CVD method.

20 bonded wafers produced as described above were prepared, and their surfaces were observed with eyes and the generation number of voids and blisters was counted. As a result, the generation number of voids and blisters per wafer was about 0.8.

Example 6

A $Si_{0.97}Ge_{0.03}$ layer (X=0.03) was grown by about 150 nm on a surface of the silicon single crystal wafer with a diameter of 200 mm by CVD method. And, a protective layer of the silicon single crystal was formed by 50 nm on the surface of the $Si_{0.97}Ge_{0.03}$ layer by CVD method. Hydrogen ions ($H^+$) were ion-implanted through the protective layer of the silicon single crystal in conditions that the implantation energy was 15 keV and the dose amount was $5\times10^{16}$ atoms/cm$^2$, thereby an ion-implanted layer was formed inside the $Si_{0.97}Ge_{0.03}$ layer. After the hydrogen ion implantation, the surface of the protective layer of the silicon single crystal was subjected to cleaning with a sulfuric acid-hydrogen peroxide solution at 120° C. for 5 minutes, and SC-1 cleaning was sequentially performed at 80° C. for 3 minutes. Then, it was closely superposed at a room temperature on a silicon single crystal base wafer having a thermal oxide film with 400 nm cleaned in the same conditions, and delaminating heat treatment was performed under an argon atmosphere at 500° C. for 30 minutes to carry out delamination at the ion implanted layer, thereby the protective layer of the silicon single crystal, and a part of the $Si_{0.97}Ge_{0.03}$ layer were transferred to the base wafer side. Next, thermal oxidation was performed at 1100° C. and a part of the $Si_{0.97}Ge_{0.03}$ layer was thermally oxidized. Then, the oxide film was removed with 5% HF aqueous solution to expose the condensation SiGe layer, and the epitaxial growth of a silicon layer was performed on the surface of the condensation SiGe layer by a thickness of 50 nm by CVD method. 20 bonded wafers produced as described above were prepared, and their surfaces were observed with eyes and the generation number of voids and blisters was counted. As a result, the generation number of voids and blisters per wafer was about 0.5.

Comparative Example 5

A $Si_{0.97}Ge_{0.03}$ layer was grown by about 150 nm on a surface of a silicon single crystal wafer with a diameter of 200 mm by CVD method. Hydrogen ions ($H^+$) were ion-implanted through the $Si_{0.97}Ge_{0.03}$ layer in conditions that the implantation energy was 40 keV and the dose amount was $5\times10^{16}$ atoms/cm$^2$ thereby an ion-implanted layer was formed on the surface of the silicon single crystal wafer. After the hydrogen ion implantation, the surface of the $Si_{0.97}Ge_{0.03}$ layer was subjected to cleaning with a sulfuric acid-hydrogen peroxide solution at 120° C. for 5 minutes, and sequentially SC-1 cleaning at 80° C. for 3 minutes. Then, it was closely superposed at a room temperature on a silicon single crystal base wafer having a thermal oxide film with 400 nm cleaned in the same conditions, and delaminating heat treatment was performed under an argon atmosphere at 500° C. for 30 minutes to carry out delamination at the ion implanted layer, thereby the $Si_{0.97}Ge_{0.03}$ layer, and a part of the silicon layer were transferred to the base wafer side. Then, by hydrogen annealing at 1200° C., bonding force was enhanced and at the same time the surface was flattened.

20 bonded wafers produced as described above were prepared, and their surfaces were observed with eyes and the generation number of voids and blisters was counted. As a result, the generation number of voids and blisters per wafer was about 8.

That is, the bonded wafers produced by according to the present invention has significantly few generation number of voids and blisters. Therefore, the effect of the present invention was confirmed.

The present invention is not limited to the embodiments described above. The above-described embodiments are mere examples, and those having the substantially same constitution as that described in the appended claims and providing the similar working effects are included in the scope of the present invention.

The invention claimed is:

1. A method for cleaning a multilayer substrate at least having a silicon single crystal wafer with a SiGe layer epitaxially grown on a surface of the silicon single crystal wafer, wherein the SiGe layer is an outermost surface layer of the substrate, the method comprising:
    forming a protective film on a surface of the SiGe layer, and then
    cleaning the multilayer substrate with a first cleaning liquid capable of etching the protective film so that the protective film remains, wherein the protective film prevents roughening of the surface of the SiGe layer while the cleaning is performed,
        wherein the cleaning is performed so that a thickness of the remaining protective film is from 1 nm to 100 nm.

2. The method for cleaning a multilayer substrate according to claim 1, wherein a composition or a temperature of the first cleaning liquid or a cleaning time is adjusted and thereby the thickness of the remaining protective film is adjusted.

3. The method for cleaning a multilayer substrate according to claim 1, wherein the multilayer substrate cleaned with the first cleaning liquid is cleaned with a second cleaning liquid which is capable of etching the protective film and which has a smaller etching rate for the protective film than the first cleaning liquid so that the protective film is removed and that the SiGe layer is exposed.

4. A method for bonding substrates, wherein a surface of the SiGe layer or the protective film which is an outermost surface layer of the multilayer substrate cleaned by using the method for cleaning a multilayer substrate according to claim 1 and a surface of another substrate are bonded directly or through an insulator film.

5. The method for cleaning a multilayer substrate according to claim 1, wherein the protective film consisting of Si is used, and the first cleaning liquid consisting of a mixed aqueous solution of $NH_4OH$ and $H_2O_2$ is used.

6. The method for cleaning a multilayer substrate according to claim 5, wherein the multilayer substrate cleaned with the first cleaning liquid is cleaned with a second cleaning liquid which is capable of etching the protective film and which has a smaller etching rate for the protective film than the first cleaning liquid so that the protective film is removed and that the SiGe layer is exposed.

7. The method for cleaning a multilayer substrate according to claim 6, wherein the second cleaning liquid consisting of a mixed aqueous solution of $NH_4OH$ and $H_2O_2$ is used.

8. The method for cleaning a multilayer substrate according to claim 7, wherein a temperature of the second cleaning liquid is lower than a temperature of the first cleaning liquid.

9. A method for cleaning a multilayer substrate at least having a silicon single crystal wafer with a SiGe layer epitaxially grown on a surface of the silicon single crystal wafer, wherein the SiGe layer is an outermost surface layer of the substrate, the method comprising:
    forming a protective film consisting of Si on a surface of the SiGe layer, cleaning the multilayer substrate with a first cleaning liquid consisting of a mixed aqueous solution of $NH_4OH$ and $H_2O_2$, which is capable of etching the protective film so that the protective film remains, wherein the protective film prevents roughening of the surface of the SiGe layer while the cleaning is performed, and then cleaning the multilayer substrate cleaned with the first cleaning liquid with a second cleaning liquid consisting of a mixed aqueous solution of $NH_4OH$ and $H_2O_2$, which is capable of etching the protective film and which has a smaller etching rate for the protective film than the first cleaning liquid so that the protective film is removed and that the SiGe layer is exposed.

10. The method for cleaning a multilayer substrate according to claim 9, wherein a composition or a temperature of the first cleaning liquid or a cleaning time is adjusted and thereby a thickness of the remaining protective film is adjusted.

11. The method for cleaning a multilayer substrate according to claim 9, wherein the cleaning is performed so that a thickness of the remaining protective film is from 1 nm to 100 nm.

12. The method for cleaning a multilayer substrate according to claim 9, wherein a temperature of the second cleaning liquid is lower than a temperature of the first cleaning liquid.

13. A method for bonding substrates, wherein a surface of the SiGe layer or the protective film which is an outermost surface layer of the multilayer substrate cleaned by using the method for cleaning a multilayer substrate according to claim 9 and a surface of another substrate are bonded directly or through an insulator film.

* * * * *